Figure 1A:
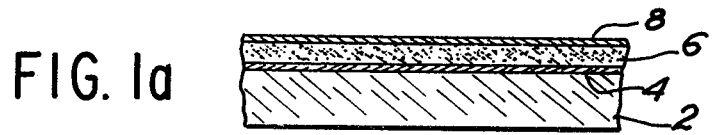

United States Patent [19]

Kumurdjian

[11] 4,167,806

[45] Sep. 18, 1979

[54] METHOD OF FABRICATION OF AN AMORPHOUS SEMICONDUCTOR DEVICE ON A SUBSTRATE

[75] Inventor: Pierre Kumurdjian, Saint Cheron, France

[73] Assignee: Commissariat a l'Energie Atomique, Paris, France

[21] Appl. No.: 835,776

[22] Filed: Sep. 22, 1977

[30] Foreign Application Priority Data

Sep. 28, 1976 [FR]   France ................................ 76 29105
Apr. 27, 1977 [FR]   France ................................ 77 12750

[51] Int. Cl.$^2$ ............................................. B01J 17/00
[52] U.S. Cl. ........................................ 29/580; 29/591; 357/2
[58] Field of Search ........................ 29/580, 589, 591; 357/2

[56] References Cited

U.S. PATENT DOCUMENTS

| 3,346,788 | 10/1967 | Belasco | 29/591 |
| 3,590,479 | 7/1971 | Devries | 29/591 |
| 3,893,229 | 7/1975 | Avid | 29/591 |
| 4,095,330 | 6/1978 | Kim | 29/580 |

*Primary Examiner*—W. Tupman

[57] ABSTRACT

An active zone between a lower electrode deposited on a substrate and an upper electrode constitutes a portion of an amorphous semiconducting layer and is defined either by the dimensions of the upper electrode or by a window formed in an insulating layer. The method of fabrication consists in forming the two electrodes and the two active and insulating layers, the active layer and insulating layer being fabricated from amorphous compounds which are constituted either wholly or in part by the same elements.

11 Claims, 14 Drawing Figures

METHOD OF FABRICATION OF AN AMORPHOUS SEMICONDUCTOR DEVICE ON A SUBSTRATE

This invention relates to a method of manufacture of amorphous semiconductor devices and to devices obtained as a result of the application of said method.

In more exact terms, the present invention is concerned with the construction of amorphous semiconductor components for switching or electrical storage. It is known that compounds such as the chalcogenides in particular have a resistivity of the semiconductor type in the amorphous solid state. These materials are obtained by high-temperature homogenization of a number of simple elements such as tellurium, arsenic, germanium and sulphur, followed by a water-quench or an air-quench. In particular, these components have advantageous properties of switching and storage. A noteworthy characteristic is that they are not impaired when placed in an environment which is subjected to nuclear radiations.

In order to obtain more details on the nature and properties of these amorphous semiconductors, reference can usefully be made to French Pat. No. 71 28048 of June 30th, 1971 as filed by the present Applicant under the title "A method of fabrication of amorphous semiconductors".

The quality and service life of these amorphous semiconductor devices depend especially on two phenomena:

in the first place on the possible diffusion of the material constituting the electrodes into the active semiconductor;

in the second place on the contamination of the active semiconductor and adjacent layers during the various stages of manufacture.

Diffusion of the material constituting the electrodes is primarily dependent on two factors: firstly on the nature of the contact metal and secondly on the porosity of the active semiconductor deposit on which the electric contacts are intended to be formed. The deposit of active semiconductors must therefore have the lowest possible degree of porosity.

Moreover, the active semiconductor is highly sensitive to contamination and more especially contamination by oxygen which is present either in the form of oxygenated compounds such as water, carbon dioxide gas or in the form of oxygen trapped in the contact electrodes or in the insulator. It is therefore necessary to prevent any structure which entails the presence of oxides or elements which can readily be oxidized and to adopt a method of deposition which produces the lowest possible degree of contamination.

The present invention is precisely directed to a number of modes of application of a method for the fabrication of amorphous semiconductors which have switching or storage properties and make it possible to prevent electrode diffusion phenomena to a very substantial extent and in particular to prevent contamination of the active semiconductors during the different stages of preparation of the component.

The amorphous semiconductor device is fabricated in accordance with said method on a substrate of the type in which provision is made for a lower electrode deposited on said substrate and an upper electrode. The device has an active zone which is located between said electrodes and is defined:

either by the dimensions of the upper electrode, said active zone being intended to constitute a portion of an amorphous semiconducting layer, or by a window framed in an insulating layer.

The method in accordance with the invention essentially consists in forming the two electrodes and the two active and insulating layers, said active layer and said insulating layer being fabricated from amorphous compounds which are constituted either wholly or in part by the same elements.

In accordance with a further distinctive feature, the insulating layer is constituted by an insulating amorphous compound in which the same constituents as the insulating layer are present either wholly or in part. Alternatively, said insulating layer is constituted by an insulating amorphous compound in which the same constituents as the active layer are present either wholly or in part.

Preferably, the amorphous compound or compounds are one of the at least ternary compounds of elements selected from the group containing germanium, tellurium, arsenic and sulphur.

In accordance with a first mode of execution of the method which results in the production of an amorphous semiconductor device of the "three layer" type, the method essentially consists in depositing successively on a substrate: a first conductive layer in order to constitute the lower electrode, an active amorphous semiconductor layer and a second conductive layer in order to constitute the second electrode. These deposits are formed within an enclosure in which a vacuum of less than $10^{-5}$ torr is maintained by successive ion bombardments of targets containing the materials constituting each layer aforesaid. The upper electrode and the active layer are then etched by mechanical erosion in order to give them suitable dimensions. The method then consists in depositing the insulating layer, in etching said insulating layer so as to form a window at the level of the upper electrode and in depositing the electric lead associated with each electrode.

In a second mode of execution of the method which results in the production of an amorphous semiconductor device of the "pore" type, the method essentially consists in etching a conductive layer in order to constitute the lower electrode, in depositing said insulating layer on said electrode and on part of the substrate, in forming a window opposite to a portion of said electrode by etching in said insulating layer, in depositing an active layer of substantially constant thickness in said window and on said insulating layer, in depositing a conductive layer on said active layer, in etching said conductive layer in order to form the second electrode. Moreover, the electrodes are preferably made of carbon or of molybdenum.

The principal features of these two alternative embodiments of the method are essentially intended to prevent contamination phenomena at the time of fabrication of the amorphous semiconductor device, especially contamination by oxygen which is present either in the form of oxygenated compounds such as water, carbon dioxide gas and so forth, or in the form of oxygen which is trapped in the contact electrodes or in the insulator. With this same object in view and in accordance with the same method, the insulating layers are formed by means of materials which do not contain oxygen (for example, the use of silica or alumina are avoided), again in order to prevent any contamination.

However, there also exist two types of phenomena which are liable to modify the characteristics of the amorphous semiconductor:

on the one hand, the diffusion of the electrodes into the thermally and/or electrically activated semiconductor and on the other hand, crystallization of the semiconductor which is initiated either by the above-mentioned diffusion or as a result of damage caused at the time of deposition of the upper electrode.

Considered alone or in combination, these modifications give rise to rapid evolution of the characteristics of the device which has thus been fabricated.

The present invention is also directed to modes of execution of the method hereinabove described which are improved to an even greater extent and make it possible at the time of fabrication of the semiconductor to prevent both the above-mentioned phenomenon of diffusion of the electrodes and the phenomenon of electromigration of these latter.

In accordance with the invention, diffusion and electromigration of the electrodes can be slowed-down to a considerable extent or even stopped by interposing between the electrode and the active semiconductor a very thin layer of another amorphous semiconductor, the function of which will be to concentrate on the thin layer alone the degrading effects hereinabove described and therefore:

to absorb and retain the diffusing atoms derived from electrodes without transmitting them to the active semiconductor; this effect is obtained by choosing a buffer semiconductor such that the reaction between this latter and the electrode is highly predominant with respect to any reaction that might take place either between said buffer electrode and the active semiconductor or between the electrode metal and the active semiconductor;

to accept a degradation which may be produced at the time of actual deposition of the upper electrode and is generally evinced by partial evolutionary crystallization. This degradation is of thermal origin in the case of deposition by thermal evaporation and is produced by implantation in the case of deposition by sputtering. The buffer semiconductor is chosen so as to ensure that the crystallization does not propagate within the active semiconductor; and if necessary to produce by dissociation elements which are chosen so as to close-off the porosities existing in the active semiconductor layer in order to slow-down a residual diffusion.

In order to obtain these results, the improved mode of execution of the invention consists in providing the electrode in the form of an electrode proper and of a barrier and also in forming the active semiconductor by means of an active layer proper and of layers which constitute buffer layers.

In accordance with the invention and depending on requirements, provision can be made for one or two barrier layers and/or one or two buffer layers according to the materials employed and the type of characteristics of amorphous semiconductor which it is desired to obtain.

More precisely and in accordance with the improved mode of execution, the method essentially consists in providing the active layer in the form of a central layer which constitutes the active layer proper and of at least one buffer layer disposed on one of the upper and lower faces of the active layer proper. Said buffer layer or layers are formed by means of a second amorphous semiconductor material which is chosen so as to ensure that the reaction between the second material and the electrodes is highly predominant with respect to any reaction which may take place either between said second material and the active semiconductor or between the electrode and the active semiconductor.

In accordance with another distinctive feature, the method is characterized in that at least one of the electrodes comprises on the one hand an electrode proper which is fabricated from a material other than carbon and on the other hand a thin layer which is directed towards the active zone formed of carbon and constituting a barrier layer.

Figure 3:
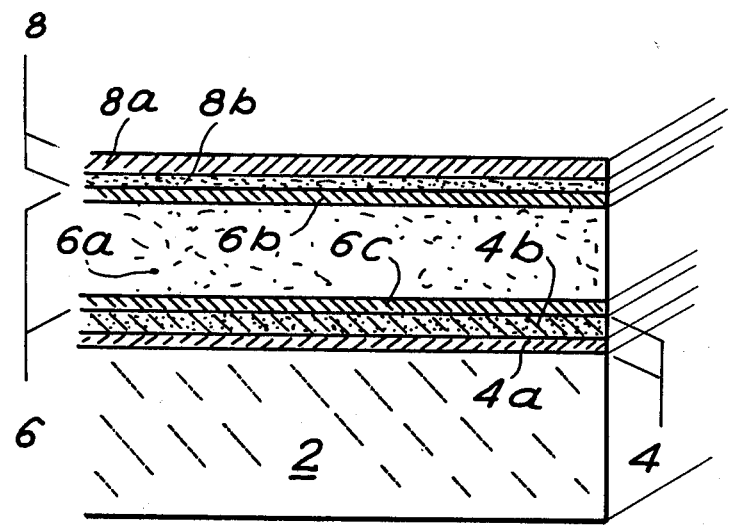

A more complete understanding of the invention will in any case be obtained from the following description in which a number of modes of execution of the invention are given by way of example without any limitation being implied, reference being made to the accompanying drawings in which:

FIGS. 1a–g illustrates the different steps of the first mode of execution of the method, FIGS. 2a–f illustrates the different steps of the second mode of execution of the method;

FIG. 3 is a part-sectional view of FIG. 1 or FIG. 2 and showing the application of the improved mode of execution of the method.

The present invention relates to two particular modes of application of the method described in the foregoing. These two modes of application correspond on the one hand to an amorphous semiconductor device of the "three layer" type and on the other hand to a device of the "pore" type. A first stage of the specification which now follows will describe the first steps of the method of fabrication of the "three layer" device. The device is so called by reason of the fact that there are formed in a single step and under vacuum the two conductive layers which correspond to the formation of the electrodes of the device and the active amorphous semiconducting layer.

The first step of this method (as shown FIG. 1a) consists in forming on a substrate 2 the three layers which are shown in FIG. 1a and which correspond respectively in the upward direction to a first conductive layer 4 which will serve to define the lower electrode, to a layer 6 of active amorphous semiconductor material and to a conductive layer 8 which will serve to define the upper electrode. One of the characteristics of this mode of execution of the method lies in the fact that the three layers 4, 6 and 8 are formed within a vacuum enclosure in which a vacuum of less than $1 \times 10^{-5}$ torr. is maintained. This mode of execution makes it possible to protect the interfaces between these three layers against any external contamination. The interior of said enclosure can in fact be very readily purified from oxygen and oxygenated compunds during the different stages of formation of the layers.

In order to form the deposits, it is possible to employ the so-called flash technique. As is already known, this technique consists in placing within the vacuum enclosure a tube which contains the product to be deposited in the form of powder. By means of this tube, the powder contained in the tube is projected onto a strip which has been heated to a temperature of the order of 600° to 800° C. or more. This is followed by immediate sublimation of the powder which is accordingly deposited on the substrate. It is apparent that this mode of deposition is very clean and that, taking into account the rapidity of sublimation, the composition of the deposit is in fact identical with that of the initial powder.

Preferably, a second method will be utilized by means of an ion beam. In this second method which is again employed under a vacuum of less than $1 \times 10^{-5}$ torr, a target constituted by the compound or the substance which it is desired to deposit on the substrate is subjected to argon bombardment which has the effect of detaching the particles from the material and depositing them on the substrate. It is apparent that this method of deposition is also very clean since no chemical reaction takes place and the atmosphere within the enclosure can readily be controlled since this method is performed in a high vacuum.

There will thus be carried out the deposition on the one hand of the material constituting the electrodes 4 and 8 which can for example be molybdenum or preferably carbon in the approximate form of graphite. Moreover, the layer of active semiconductors 6 will also be deposited by the same method. This compound is an adequate mixture of arsenic, tellurium, germanium and sulphur, for example.

In the case of carbon electrodes, it will be found preferable to start with a pyrolytic deposition of carbon in the case of the electrode 4, this electrode being then completed with a very thin deposit of carbon preceded if necessary by ionic erosion. This erosion can be carried out by means of the argon beam which has already been employed for the deposition.

Figure 1B:
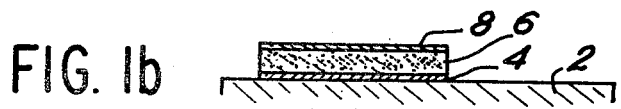

In the following stage which is shown in FIG. 1b, the triple layer 4, 6 and 8 is etched to the size of the lower electrode 4. In order to prevent any contamination, this etching process is carried out by mechanical erosion and by the dry route. The method adopted is that of etching by argon beam, the rate of which is controlled with high precision. As can clearly be understood, the advantage of this technique lies in the fact that this latter does not introduce any pollution since all forms of contamination by chemical solutions are avoided. In addition, the depth of erosion can readily be adjusted.

Figure 1C:
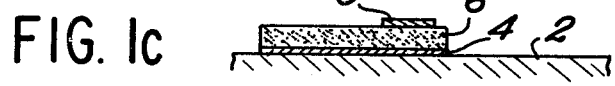
Figure 1D:
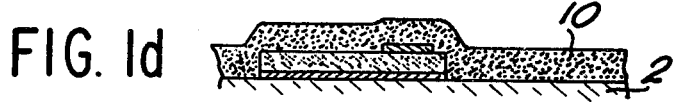

In the following step shown in FIG. 1c, the same method is employed for etching the upper electrode 8 in order to give this latter the final dimension which will define the active zone of the device.

In the following stage, a uniform deposit of an insulating material which forms the insulating layer 10 is carried out by any known means. This insulating material can consist of the same material as the active layer 6. In this case the layer 10 has a sufficient thickness to produce an insulation. In the other case, the layer 10 which will be of smaller thickness will be formed by means of an amorphous insulating material constituted by all or part of the same basic constituents as the active zone 6 but in different proportions which result in a material having insulating characteristics. It is in fact known that, if consideration is given to the ternary diagram Ge, As, Te or the quaternary diagram Ge, As, Te, S, there exist regions having insulating characteristics and regions having semiconducting characteristics.

In all cases, the insulator is never constituted in accordance with conventional practice by silica or alumina or by any other oxide, but by a compound having the same basic constituents as the active portion. In some cases this compound can be identical with the material which forms the active portion.

Figure 1E:
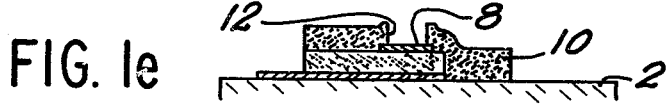
Figure 1F:
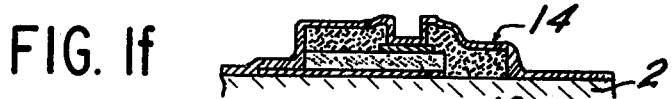
Figure 1G:
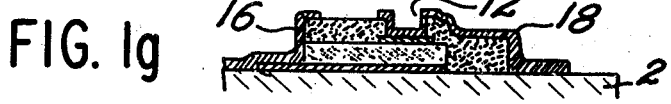
Figure 2A:
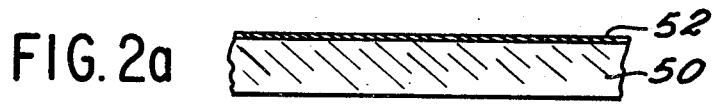
Figure 2B:
Figure 2C:
Figure 2D:
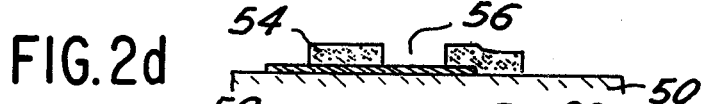
Figure 2E:
Figure 2F:
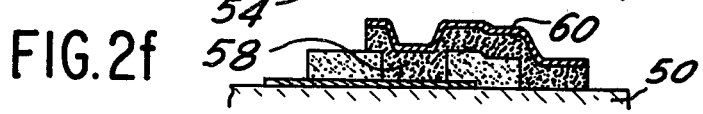

In the following step shown in FIG. 1e, the insulating layer is etched, preferably by employing the process of ionic etching by argon bombardment. A window 12 is also defined in the insulating layer above the upper electrode 8. In the following step shown in FIG. 1f, a uniform deposit of conductive material 14 is carried out. Etching of the conductive deposit 14 is then performed in the step shown in FIG. 1g in order to separate the connection of the lower electrode designated by the reference 16 from the connection of the upper electrode designated by the reference 18.

It is therefore apparent that a switching structure is thus obtained and that the contamination of this structure at the level of the active portion 6 is reduced to a minimum. Moreover, this result is largely obtained by virtue of the fact that the insulating layer is constituted by a substance which contains the same basic compounds.

In the diagrams of FIG. 2, there is shown a second mode of execution of the method for fabricating the switching structures of the "pore" type. In this second mode of execution, the same techniques are again employed for the purpose of preventing any contamination at the moment of fabrication of the device. Similarly, the basic constituents of the material which forms the active portion of the device are again employed for the purpose of forming the insulating layer of the circuit.

The first step (2a) consists in forming the first electrode 52 on the substrate, this deposit being then etched in order to give it the desired shape (2b). A uniform deposit 54 of the insulating layer is then carried out with the same materials as the insulating layer 12 of FIG. 1e. By making use of the method described previously, the layer 54 is then etched in order to form the window 56 which defines the active zone of the semiconductor component. In order to minimize contamination, ionic stripping is performed immediately prior to deposition of the active layer 58. This stripping process is applied to that portion of the electrode 52 which is located opposite to the window 56. A second conductive layer 60 is then deposited (step 2e). Finally, the conductive layer 60 and the active layer 58 are eteched in order to expose the electrical lead terminals. In fact, the conductive deposit 60 can be carried out in two stages which consist first in the formation of a carbon deposit and then, above this latter, an aluminum lead deposit.

As has already been mentioned, the conductive layers can be formed of molybdenum or of carbon, depending on the types of construction.

Molybdenum cannot readily be deposited if it is desired to have a layer which is free from stresses or flaws and non-evolutive with the electrical or thermal pulses which are applied thereto. Moreover, the oxygen which is present is very readily trapped by molybdenum. It is established that these conditions are all met at the same time if the layer is deposited in a vacuum which is as high as possible and particularly free from oxygenated compounds, at high speed and on a very hot substrate ($>400°$ C.).

The deposition technique which has been adopted consists of sputtering by a beam of argon atoms in a pump set for producing a clean vaccum which is free of oil. By way of example, this set can consist of a turbomolecular pump with air-cushion lubrication associated with a liquid nitrogen trap. The vacuum pump set must satisfy the criterion of minimum emission of oxidized contaminants.

The deposition technique which is chosen for dissociating the ion source from the sputtering proper makes it possible to form a deposit under low ambient pressure. Moreover, by direct positioning of the substrate beneath the beam, this method permits cleaning of the layer which has previously been deposited and thus makes it possible to remove any oxide film which may have formed at the time of return to atmospheric pressure. By virtue of this technique, the oxygen which may have been trapped in this first deposit can be preferentially removed by etching.

The use of carbon is preferable to that of molybdenum since carbon does not retain oxygen and is particularly inert at low temperatures. The first deposit will be a carbon obtained by pyrolytic process, preferably at a pressure higher than 10 torr in order to obtain a graphitized structure.

The active amorphous semiconductor will be deposited as in the previous instance, cleaning of the carbon layer being first carried out by the beam.

The second carbon layer will be deposited by means of an electron gun but in separate sequences of gun extinctions in order to prevent untimely heating of the amorphous semiconductor.

As has already been mentioned, the invention is also concerned with an improved mode of execution of the method which is applicable both to the case of the "triple layer" structure and to the case of the "pore" structure.

FIG. 3 shows the modifications of the triple-layer structure corresponding to the stage of fabrication of the device which is illustrated in FIG. 1b. In order to gain a clearer understanding, the same references as those appearing in this figure are again employed. In other words, the reference 2 designates the substrate on which the semiconductor device is formed, the reference 4 designates the lower electrode, the reference 6 designates the active portion of the device and the reference 8 designates the upper electrode. This figure therefore illustrates the improvements in the case of fabrication of the triple-layer device. In more exact terms, this figure illustrates the more complete case of fabrication of the device which includes these improvements.

More precisely and as mentioned earlier, the lower and upper electrodes 4 and 8 respectively and the active portion 6 have a more complex structure than that which has been contemplated in the main patent Application. The lower electrode 4 comprises an electrode proper 4a which is directly in contact with the substrate 2 and a barrier layer 4b. Similarly, the upper electrode comprises an electrode proper 8a and a barrier layer 8b. Likewise the active zone comprises an active zone proper 6a and an upper buffer layer 6b as well as a lower buffer layer 6c. The buffer and barrier layers have the respective functions which have already been indicated in the foregoing.

Before explaining the steps of the method corresponding to these new and novel portions of the device, the composition of this latter will first be defined. The active layer proper 6a has the same structure as that defined in the main patent Application.

The layers constituting the barriers, namely the layers 4b and 8b are preferably formed of carbon. It is clearly apparent that these barrier layers exist only if the electrodes proper 4a and 8a are fabricated from a material which is not carbon. For example, the layers 4b and 8b will exist if the electrodes are fabricated from molybdenum, aluminum, gold and so forth.

The buffer layers 8b and 8c have an anti-diffusion function, especially in the case in which barriers do not exist. Furthermore, the upper barrier layer 6b has the intended function of closing-off the pores existing in the amorphous semiconductor proper 6a in order to prevent instantaneous diffusion of the electrode. This layer 6b or these buffer layers 6b and 6c can be fabricated from different materials, depending on the type of property exhibited by the amorphous semiconductor material proper 6a. In the event that the device is a storage device, tellurium can accordingly be employed. On the contrary, in the event that the switching properties of the amorphous semiconductor material are utilized, it will be preferable to make use of special glasses and, in particular, glass having a base of tellurium, arsenic, germanium, sulphur, and having the following composition: $Te_{60}$, $As_{25}$, $Ge_{13}$, $S_1$.

In different cases and depending in particular on the intended use of the device and especially on the nature of the material constituting the electrodes proper 4a and 8a, it will in fact be possible to obtain an upper and lower buffer layer or only an upper or lower buffer layer or else an upper barrier layer or a lower barrier layer and so forth. All combinations can accordingly be contemplated.

In regard to the method or more precisely the method corresponding to the fabrication of these barrier and buffer layers, these latter are formed at the same time as the active layer 6a proper and the electrodes 8a and 4a. Fabrication of these layers will therefore take place within an enclosure in which a high vacuum has been produced, in accordance with either of the two alternative embodiments of the method which has been described in the foregoing. It will clearly be necessary to provide new sources in order to obtain an effective deposit by means of either of these methods.

However, it must be clearly understood that in the main patent the electrode layers were directly in contact with the active layer and that the problem was to avoid contamination of the active material. Within the scope of the improvements made in the present Application for a Certification of Addition, other intermediate layers are formed between the electrode proper and the active material proper. In consequence, it is very possible to form the lower electrode proper 4a after introduction within the vacuum enclosure and then, after the deposition operations have been completed within the vacuum enclosure, to form the upper electrode proper 8a outside said enclosure. This makes it possible to reduce the number of depositions to be performed within the vacuum enclosure while retaining the advantages which have already been described.

Furthermore, it can be mentioned that, in the event that the electrodes are of aluminum, the barrier layers are formed by means of an electron gun whereas a pyrolytic deposition will be employed in the case of other materials.

In order to obtain the complete amorphous semiconductor device, the subsequent steps corresponding to FIGS. 1b to 1g and described earlier will be carried out. The only difference lies in the fact that the active zone 6 and the upper and lower electrodes 4 and 8 have the particular structure defined above. In particular, deposition of the insulating layer and deposition by sputtering in the case of the electrical connections are carried out under exactly the same conditions.

The foregoing description referred more particularly to the improvements related to the "triple layer" method. It can easily be understood that these improvements are just as readily applicable to the fabrication of the amorphous semiconductor device of the "pore"

type. In order to understand the practical application of this method in accordance with this alternative form, it is sufficient to appreciate that the lower electrode 52 of FIG. 2 can be constituted if necessary by a lower electrode proper and a barrier layer as described earlier, that the active zone 58 can also comprise an upper and lower buffer zone and similarly that the upper electrode designated by the reference 60 in FIG. 2 can be constituted by a barrier layer and an electrode proper which in fact constitutes the upper electrode 60.

What we claim is:

1. A method for manufacturing an amorphous semiconductor device, including the steps of
    (a) depositing on a substrate a first conductive layer to form a lower electrode;
    (b) depositing on said first conductive layer an active amorphous semiconductor layer made of an amorphous semiconducting material;
    (c) deposing on said active layer a second conductive layer to form an upper electrode;
    (d) etching the second conductive layer to predeterminded dimensions;
    (e) depositing an insulating layer over said etched second conductive layer and said amorphous semiconducting layer, said insulating layer comprising at least in part the same material as the amorphous semiconductor material;
    (f) etching the insulating layer above said etched second conductive layer and the material above a portion of said first conductive layer spaced from said second conductive layer, and
    (g) depositing electric connections associated with each electrode.

2. A method according to claim 1, wherein said insulating layer comprises the same amorphous material as that of said active layer, the thickness of said insulating layer being sufficient to ensure electrical insulation.

3. A method according to claim 1, wherein said insulating layer comprises an insulating amorphous material having at least part of the same constituents as said active layer.

4. A method according to claim 2, wherein the amorphous material comprises at least one ternary compound of elements selected from the group comprising germanium, tellurium, arsenic and sulphur.

5. A method according to claim 1, wherein the conductive layers comprise a material selected from the group consisting of carbon and molybdenum.

6. A method according to claim 1, wherein said active layer is deposited in the form of a central layer constituting the active layer proper and of at least one buffer layer disposed on one of the faces of the active layer proper, said buffer layer being formed by means of a second amorphous semiconductor material chosen to ensure that reaction between the second material and the conductive layer is highly predominant with respect to any reaction which may take place either between said second material and the active semiconductor or between the conductive layer and the active semiconductor.

7. A method according to claim 1 wherein at least one of the electrodes is fabricated from a noncarbonaceous material and by a thin layer which is directed towards the active zone formed of carbon and constituting a barrier layer.

8. A method according to claim 6, wherein said second material is a glass having the composition $Te_{60}As_{25}Ge_{13}S_1$.

9. A method according to claim 7 wherein at least one buffer layer and a layer which constitutes a barrier, are formed.

10. A method according to claim 1 wherein the deposits of the first conductive layer, the active amorphous semiconductor layer, and the second conductive layer are accomplished by bombarding targets containing the materials comprising the three layers respectively, in an enclosure and by maintaining within said enclosure a vacuum of at least $10^{-5}$ torr.

11. A method according to claim 1 wherein the etching of the second conductive layer is performed by mechanical erosion.

* * * * *